(12) United States Patent
Kaltalioglu et al.

(10) Patent No.: US 8,748,295 B2
(45) Date of Patent: Jun. 10, 2014

(54) PADS WITH DIFFERENT WIDTH IN A SCRIBE LINE REGION AND METHOD FOR MANUFACTURING THESE PADS

(75) Inventors: Erdem Kaltalioglu, Newburgh, NY (US); Matthias Hierlemann, Karlsfeld (DE)

(73) Assignee: Infineon Technologies AG, Neubiberg (DE)

( * ) Notice: Subject to any disclaimer, the term of this patent is extended or adjusted under 35 U.S.C. 154(b) by 385 days.

(21) Appl. No.: 12/484,497

(22) Filed: Jun. 15, 2009

(65) Prior Publication Data

US 2010/0314619 A1 Dec. 16, 2010

(51) Int. Cl.
*H01L 23/544* (2006.01)

(52) U.S. Cl.
USPC ............................................. 438/462; 73/799

(58) Field of Classification Search
USPC ..................... 257/355; 438/17, 462; 73/799
See application file for complete search history.

(56) References Cited

U.S. PATENT DOCUMENTS

| 2005/0179213 A1* | 8/2005 | Huang et al. ................... 277/620 |
| 2009/0014717 A1* | 1/2009 | Kuo et al. ......................... 257/48 |
| 2009/0201043 A1* | 8/2009 | Kaltalioglu ................... 324/765 |

FOREIGN PATENT DOCUMENTS

WO WO 2004/073014 A2 8/2004

* cited by examiner

*Primary Examiner* — Thomas L Dickey
(74) *Attorney, Agent, or Firm* — Slater & Matsil, L.L.P.

(57) ABSTRACT

Test structures for semiconductor devices, methods of forming test structures, semiconductor devices, methods of manufacturing thereof, and testing methods for semiconductor devices are disclosed. In one embodiment, a test structure for a semiconductor device includes at least one first contact pad disposed in a first material layer in a scribe line region of the semiconductor device. The at least one first contact pad has a first width. The test structure also includes at least one second contact pad disposed in a second material layer proximate the at least one first contact pad in the first material layer. The at least one second contact pad has a second width that is greater than the first width.

30 Claims, 7 Drawing Sheets

PADS WITH DIFFERENT WIDTH IN A SCRIBE LINE REGION AND METHOD FOR MANUFACTURING THESE PADS

TECHNICAL FIELD

The present invention relates generally to the fabrication of semiconductor devices, and more particularly to test structures and methods for semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual die are singulated by sawing the integrated circuits along a scribe line. The individual die are then packaged separately, in multi-chip modules, or in other types of packaging, for example.

One recent type of packaging for semiconductor devices is referred to as an embedded wafer level package (eWLP). An eWLP includes a redistribution layer (RDL) that is used to connect the die to bond pads or contacts on the eWLP. The wiring for RDL is in close proximity to conductive lines on the chip, and packaging die in eWLPs can result in shorts. Some integrated circuits have sacrificial contact pads that are included in scribe line regions for testing, portions of which remain on the chip after the singulation process. The portions of the contact pads can remain in the structure and create shorts to the RDL of eWLPs.

Thus, what are needed in the art are improved test structures and methods for semiconductor devices, particularly for semiconductor devices packaged in eWLPs.

SUMMARY OF THE INVENTION

These and other problems are generally solved or circumvented, and technical advantages are generally achieved, by preferred embodiments of the present invention, which provide novel test structures for semiconductor devices, semiconductor devices, methods of fabrication thereof, and methods of testing semiconductor devices.

In accordance with one embodiment of the present invention, a test structure for a semiconductor device includes at least one first contact pad disposed in a first material layer in a scribe line region of the semiconductor device. The at least one first contact pad has a first width. The test structure also includes at least one second contact pad disposed in a second material layer proximate the at least one first contact pad in the first material layer. The at least one second contact pad has a second width that is greater than the first width.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
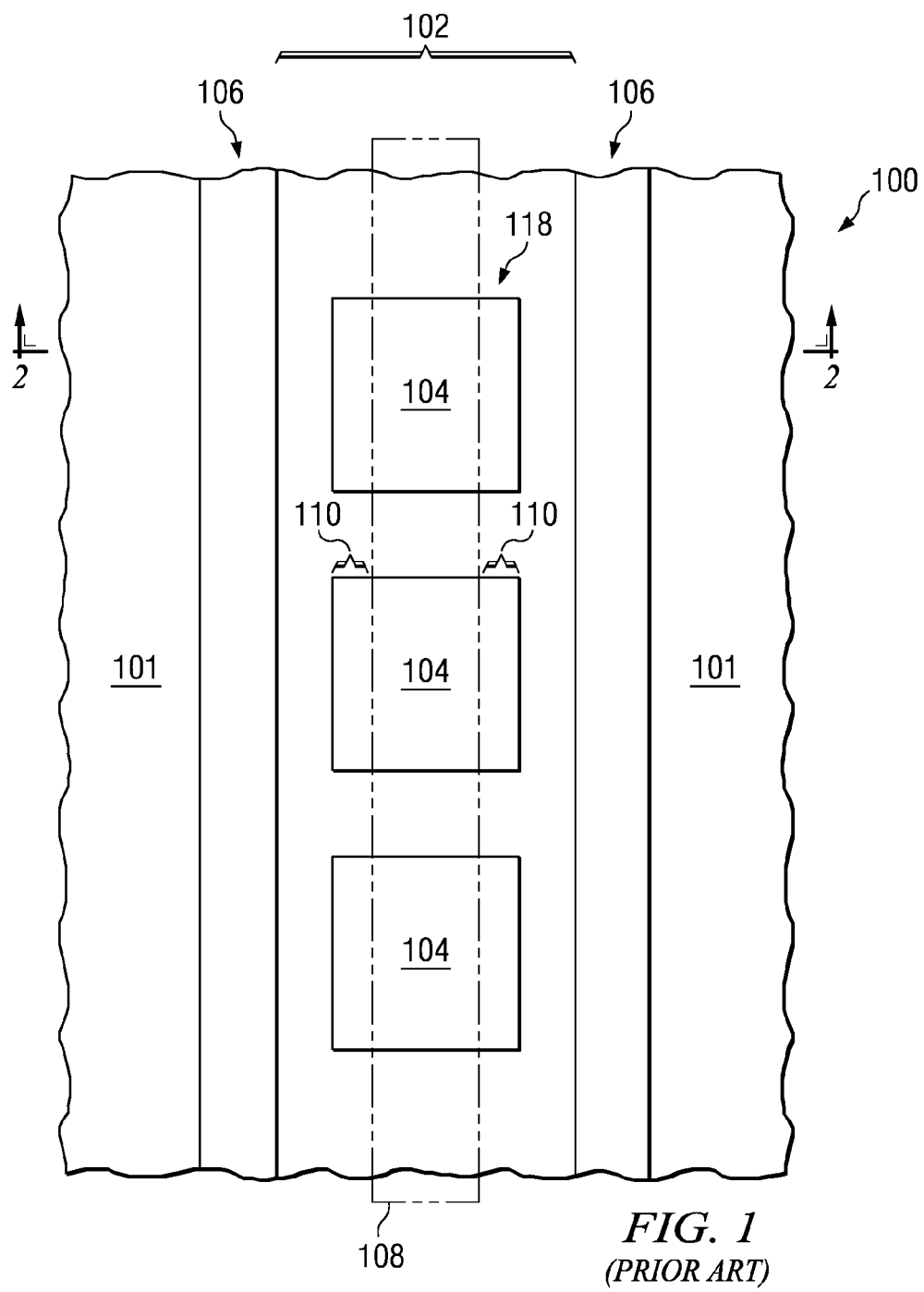
FIG. 1 is a top view of a prior art test structure for a semiconductor device.
Figure 2:
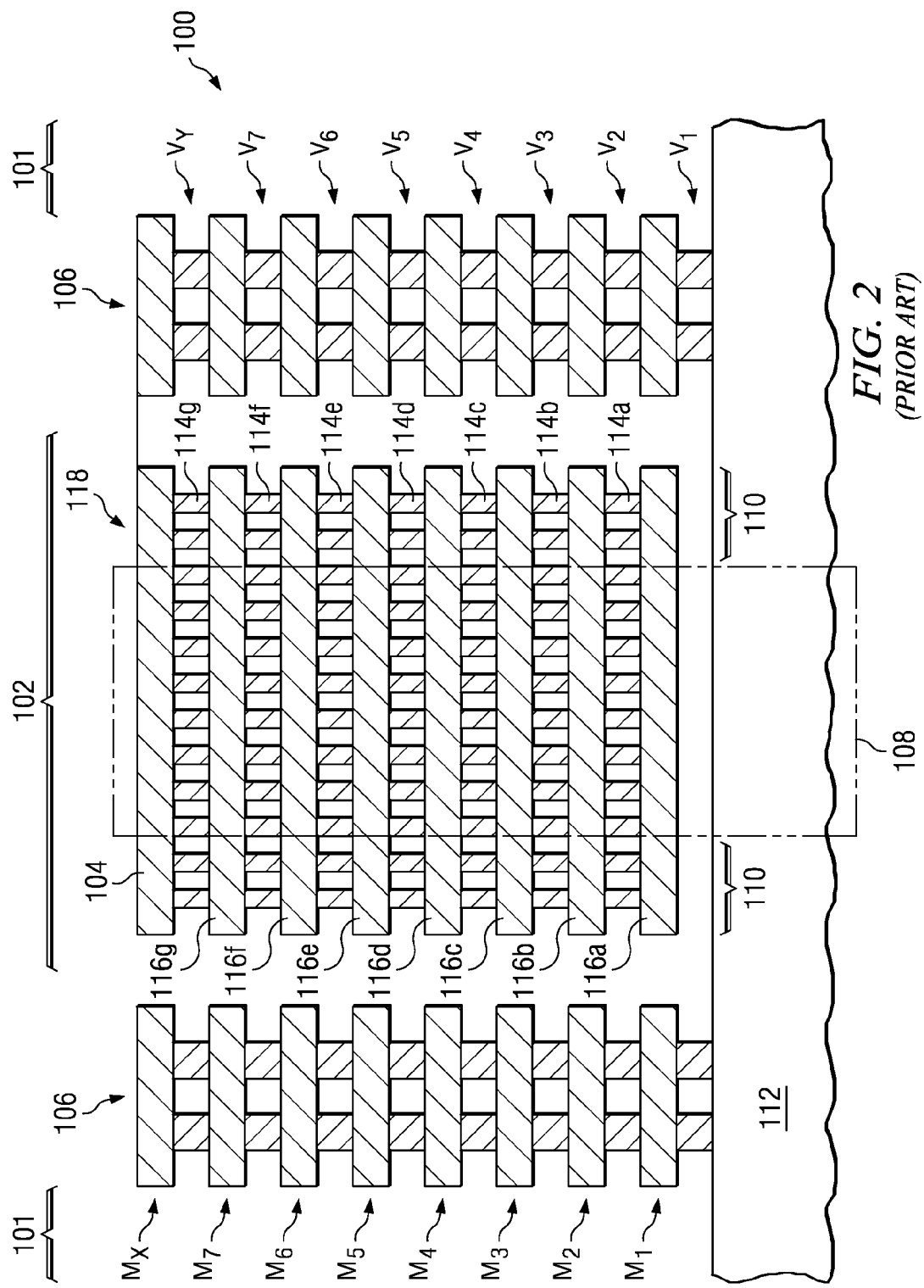
FIG. 2 is a cross-sectional view of the prior art test structure shown in FIG. 1.

FIG. 1 is a top view of a prior art test structure 118 for a semiconductor device. FIG. 2 is a cross-sectional view of the prior art test structure 118 shown in FIG. 1. The test structure 118 includes multiple contact pads 104 that are formed in scribe line regions 102 of a semiconductor wafer 100 in a top metallization layer $M_X$. The scribe line regions 102 may comprise the dicing channel or kerf of the integrated circuits 101. A portion of the semiconductor wafer 100 comprising the prior art test structure 118 is shown in FIGS. 1 and 2. The scribe line regions 102 are located between crack stops or crack prevention structures 106 that are formed along a perimeter of integrated circuits, chips, or die 101 of the semiconductor wafer 100. The crack prevention structures 106 may include conductive structures formed in metallization layers $M_1, M_2, M_3, M_4, M_5, M_6, M_7, M_X, V_1, V_2, V_3, V_4, V_5, V_6, V_7$, and $V_Y$ of the semiconductor device.

The prior art test structure 118 also includes contact pads 116a, 116b, 116c, 116d, 116e, 116f, and 116g formed in metallization layers such as conductive line layers $M_1, M_2, M_3, M_4, M_5, M_6$, and $M_7$, respectively, of the semiconductor device, over a semiconductor workpiece 112, beneath contact pads 104 formed in metallization layer $M_X$. Vias 114a, 114b, 114c, 114d, 114e, 114f, and 114g may optionally be formed in metallization layers such as via layers $V_2, V_3, V_4, V_5, V_6, V_7$, and $V_Y$, respectively, as shown. The vias 114a, 114b, 114c, 114d, 114e, 114f, and 114g may couple together the contact pads 116a, 116b, 116c, 116d, 116e, 116f, and 116g, so that an upper contact pad 104 may be probed for testing an underlying portion of the workpiece 112 or integrated circuit 101.

After a semiconductor device is manufactured and the prior art test structure 118 is used to test the integrated circuits 101, the integrated circuits 101 are singulated, separating them from one another. The integrated circuits 101 are singulated using a saw, laser dicing, or laser dicing followed by saw dicing. In FIGS. 1 and 2, the width of a saw blade is illustrated in phantom at 108, indicating the portion of the prior art test structure 118 that is removed during the dicing or singulation process. A portion 110 of the test structure 118 is left remaining at the perimeter of the integrated circuits 101, as shown.

Figure 3:
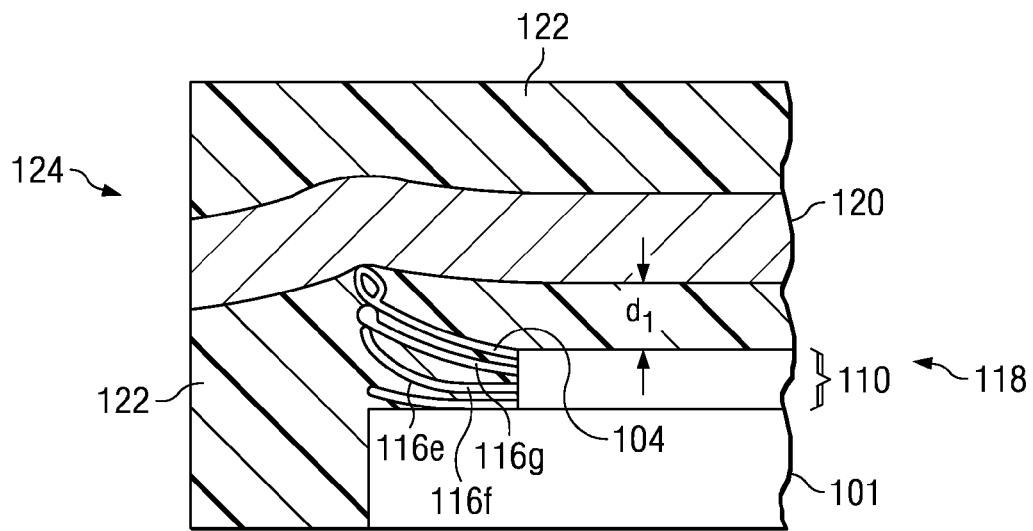
FIG. 3 shows a cross-section of a packaged integrated circuit that includes the prior art test structure of FIGS. 1 and 2, illustrating shorts that may occur between contact pads of prior art test structures and a redistribution layer of the packaged integrated circuit.

A problem with the prior art test structure 118 is that the remaining portions of the test structure 118 in regions 110 may cause shorts, due to delamination of the portions of the test structure 118 in regions 110 during the dicing process. For example, FIG. 3 shows a cross-section of a packaged integrated circuit 124 that includes the prior art test structure 118 of FIGS. 1 and 2, illustrating shorts that may occur between contact pads 104, 116g, 116f, and 116e in regions 110 and a redistribution layer 120 of the packaged integrated circuit 124. The encapsulation material of the packaged integrated circuit 124 is shown at 122. The delaminated portions of the contact pads 104, 116g, 116f, and 116e in regions 110 may make contact with wiring of the redistribution layer 120 of the packaged integrated circuit 124, causing device failures and decreased yields. In an eWLP, the distance or dimension $d_1$ between the redistribution layer 120 and the remaining contact pads 104, 116g, 116f, and 116e in regions 110 may be very small, e.g., about 6 μm, causing a high likelihood of shorts if delamination occurs of portions of the contact pads 104, 116g, 116f, and/or 116e of prior art test structures 118.

Thus, what are needed in the art are improved test structure designs for semiconductor devices that do not result in shorts in subsequent packaging processes.

Embodiments of the present invention provide novel test structures that have contact pads with varying widths. The vertical stacks of contact pads of the test structures include contact pads in at least every other conductive material layer that have a width or less of a saw blade or laser beam used to singulate the die, so that the wider contact pads in adjacent conductive material layers do not result in shorts.

The present invention will be described with respect to preferred embodiments in specific contexts, namely, test structures for integrated circuits and semiconductor devices. Embodiments of the invention may also be applied, however, to other applications that would benefit from test structures, for example.

Figure 4:
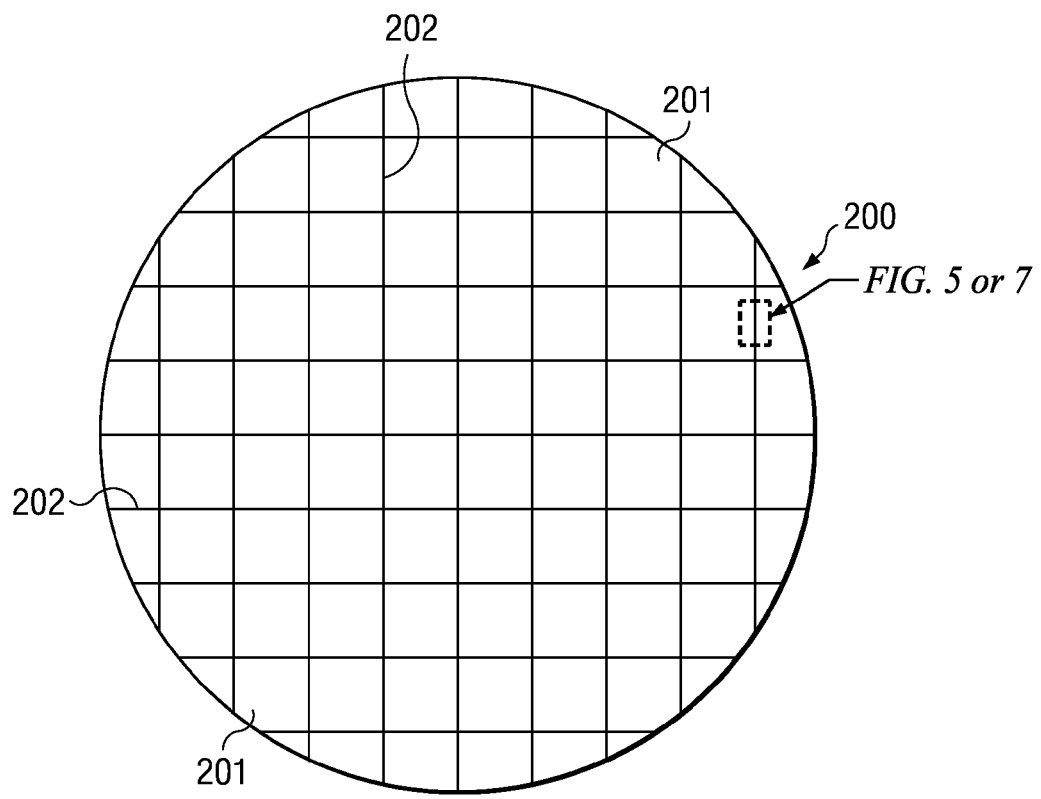
FIG. 4 is a top view of a semiconductor wafer including a plurality of die in accordance with an embodiment of the present invention.

FIG. 4 shows a top view of a semiconductor wafer 200 including a plurality of die 201 in accordance with an embodiment of the present invention. The wafer 200 is generally round in a top view, and may include alignment features such as notches or straight edges, not shown. The wafer 200 includes a plurality of die 201 formed across a top surface. The semiconductor wafer 200 is also referred to herein as a semiconductor device, e.g., before singulation.

The die 201 of the semiconductor wafer 200 may be square or rectangular in shape. Each die 201 includes an integrated circuit region 203 (see FIG. 5) that includes circuitry and/or electrical components or elements. The integrated circuit region 203 comprises an interior region of the die 201 that comprises an active region, e.g., containing functioning circuitry. The die 201 are also referred to herein as integrated circuits or semiconductor devices, e.g., after singulation.

After fabrication, the plurality of die 201 is separated from other die 201 on the wafer 200 at scribe line regions 202 disposed between the die 201. The scribe line regions 202 are located at the perimeter of the die 201, e.g., in the kerf. The scribe line regions 202 may comprise a width of about 40 to 180 μm, for example, although alternatively, the scribe line regions 202 may comprise other dimensions.

Figure 5:
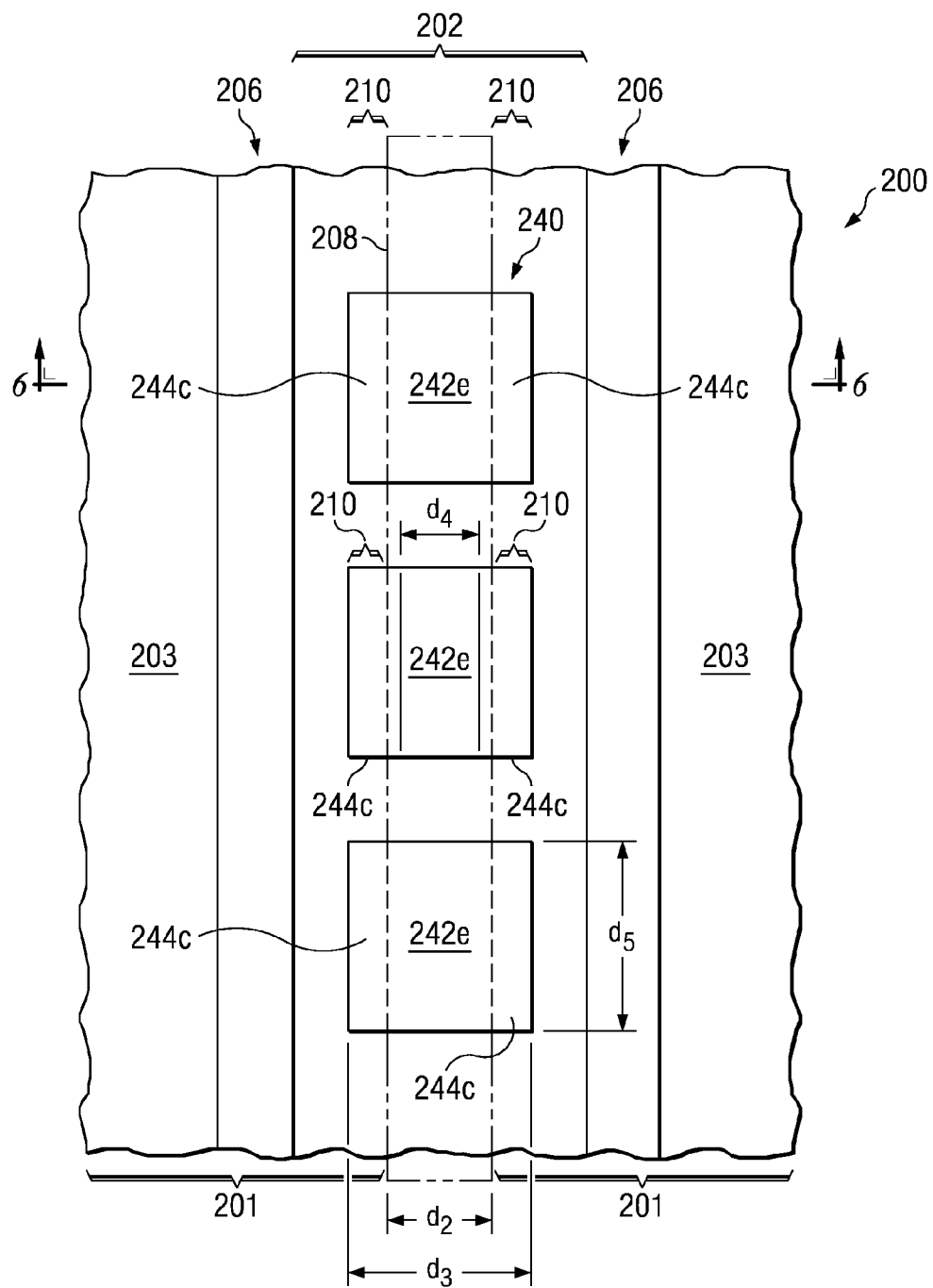
FIG. 5 is a more detailed view of a scribe line region of the semiconductor wafer shown in FIG. 4, illustrating a top view of a novel test structure in accordance with an embodiment of the present invention.

At the end of the manufacturing process, a saw and/or a laser may be used to singulate the die 201 at the scribe line regions 202, detaching the die 201 from adjacent die 201. The saw and/or laser cuts the wafer 200 at the scribe line regions 202. The singulation of the die 201 may also be performed by laser dicing, or by laser scribing followed by saw dicing, as examples. After the singulation process, each die 201 may optionally include a crack prevention structure 206 disposed at a perimeter thereof, and a portion of a test structure 240 in region 210, as shown in FIG. 5. The die 201 chip dicing process may create cracks or delaminations within back-end-of-the line (BEOL) dielectric materials and other materials, penetrating into the interior region of the die 201 and causing chip failures. Thus, a crack stop or crack prevention structure 206 may be included in the integrated circuit 201 design.

FIG. 5 is a more detailed view of a portion of the wafer 200 shown in FIG. 4, illustrating a top view of a die 201 of FIG. 4 that includes a novel test structure 240 before singulation in accordance with an embodiment of the present invention. The test structure 240 is formed in at least two conductive material layers of the integrated circuit or die 201, for example. The test structure 240 may be formed proximate an optional crack barrier, crack prevention structure, or crack stop 206 formed along the perimeter region of the die 201, as shown. The test structure 240 is formed between the edge of each die 201 and the interior integrated circuit region 203 of the integrated circuit 201. In some embodiments, the test structure 240 is formed between the crack barrier 206 and what will be the edge of the die 201 after singulation.

Figure 6:
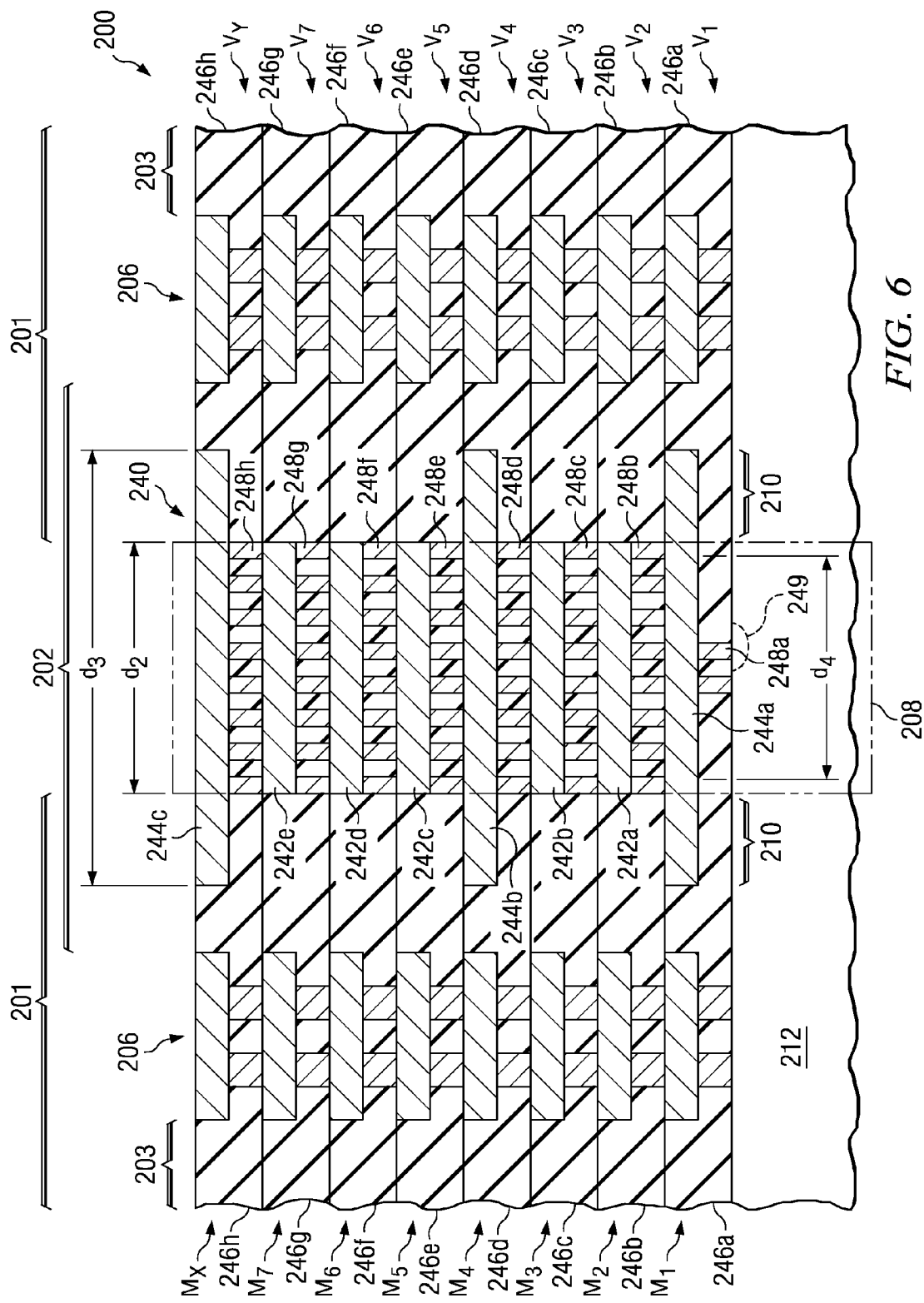
FIG. 6 shows a cross-sectional view of the test structure shown in FIG. 5.

FIG. 6 shows a cross-sectional view of the test structure 240 shown in FIG. 5. The test structure 240 comprises a conductive structure and is disposed proximate the perimeter region of the integrated circuits 201. The test structure 240 includes at least one first contact pad 242a, 242b, 242c, 242d, and/or 242e disposed in a first material layer $M_2, M_3, M_5, M_6$, and/or $M_7$, respectively, in the scribe line region 202 of the semiconductor device 200. The test structure 240 also includes at least one second contact pad 244a, 244b, and/or 244c disposed in a second material layer $M_1, M_4$, and/or $M_X$, respectively, proximate the at least one first contact pad 242a, 242b, 242c, 242d, and/or 242e in the first material layers $M_2, M_3, M_5, M_6$, and/or $M_7$, as shown. The at least one first contact pad 242a, 242b, 242c, 242d, and/or 242e and the at least one second contact pad 244a, 244b, and/or 244c of the test structure 240 may be formed within one or more insulating material layers 246a, 246b, 246c, 246d, 246e, 246f, 246g, and/or 246h disposed over a workpiece 212, for example. The insulating material layers 246a, 246b, 246c, 246d, 246e, 246f, 246g, and 246h are also referred to herein as insulating materials.

The at least one first contact pad 242a, 242b, 242c, 242d, and/or 242e has a first width or dimension $d_2$ or $d_4$, and the at least one second contact pad 244a, 244b, and/or 244c has a second width $d_3$. The second width $d_3$ of the at least one second contact pad 244a, 244b, and/or 244c is greater than the first width $d_2$ or $d_4$ of the at least one first contact pad 242a, 242b, 242c, 242d, and/or 242e. The second width $d_3$ may be greater than the first width $d_2$ or $d_4$ by about 5 μm or greater in some embodiments, as an example.

The at least one first contact pad 242a, 242b, 242c, 242d, and/or 242e may have a first width or dimension $d_2$ that may comprise about a width of a saw blade and/or laser beam used to separate the plurality of die 201 in some embodiments, for example. The at least one first contact pad 242a, 242b, 242c, 242d, and/or 242e may alternatively have a first width or dimension $d_4$ that is less than a width of a saw blade and/or laser beam used to separate the plurality of die 201 in other embodiments, as another example. The first width $d_2$ or $d_4$ of the at least one first contact pad 242a, 242b, 242c, 242d, and/or 242e is selected to be a dimension such that when the die 201 are singulated, the entire at least one first contact pad 242a, 242b, 242c, 242d, and/or 242e is completely removed from the die 201, in some embodiments. In other embodiments, the first width $d_2$ or $d_4$ of the at least one first contact pad 242a, 242b, 242c, 242d, and/or 242e is selected to be a dimension such that when the die 201 are singulated, substantially all of the at least one first contact pad 242a, 242b, 242c, 242d, and/or 242e is completely removed from the die 201.

The optional crack prevention structure 206 is shown in more detail in FIG. 6. The crack prevention structure 206 may comprise a metal structure formed in one or more metallization layers $M_1, M_2, M_3, M_4, M_5, M_6, M_7, M_X, V_1, V_2, V_3, V_4, V_5, V_6, V_7$, and $V_Y$ of the semiconductor device 200. The test structure 240 may be formed in the same material layers that the crack prevention structure 206 is formed in, for example.

The test structure 240 is formed in two or more material layers of the integrated circuit 201 in some embodiments. The test structure 240 is formed in two or more conductive line layers of the integrated circuit 201 in other embodiments. In the embodiment shown in FIG. 6, the test structure 240 is formed in eight conductive line layers $M_1, M_2, M_3, M_4, M_5, M_6, M_7$, and $M_X$; alternatively, the test structure 240 may be formed in only two conductive line layers $M_1, M_2, M_3, M_4, M_5, M_6, M_7$, or $M_X$. For example, the test structure 240 may comprise a single first contact pad 242e formed in conductive line layer $M_7$ and a single second contact pad 244c formed in conductive line layer $M_X$. Alternatively, as another example, the test structure 240 may comprise a single first contact pad 242a formed in conductive line layer $M_2$ and a single second contact pad 244a formed in conductive line layer $M_1$. The first contact pads 242a, 242b, 242c, 242d, and/or 242e and the second contact pads 244a, 244b, and/or 244c may be formed in each conductive line layer $M_1, M_2, M_3, M_4, M_5, M_6, M_7$, and $M_X$ of a semiconductor device, or in only some conductive line layers $M_1, M_2, M_3, M_4, M_5, M_6, M_7$, and $M_X$ of a semiconductor device. In some embodiments, at least one first contact pad 242a, 242b, 242c, 242d, and/or 242e is formed between each two adjacent second contact pads 244a, 244b, and/or 244c.

A plurality of vias 248a, 248b, 248c, 248d, 248e, 248f, 248g, and 248h may optionally be formed between some or all of the conductive line layers $M_1, M_2, M_3, M_4, M_5, M_6, M_7$, and $M_X$, in via layers $V_1, V_2, V_3, V_4, V_5, V_6, V_7$, and $V_Y$, as shown. The optional vias 248a, 248b, 248c, 248d, 248e, 248f, 248g, and 248h may be used to couple together the first and second contact pads 242a, 242b, 242c, 242d, 242e, 244a, 244b, and/or 244c and/or to couple the first and second contact pads 242a, 242b, 242c, 242d, 242e, 244a, 244b, and/or 244c to active areas 249 of the workpiece 212. The vias 248a, 248b, 248c, 248d, 248e, 248f, 248g, and 248h may comprise the same size as vias formed elsewhere in the via layers $V_1, V_2, V_3, V_4, V_5, V_6, V_7$, and $V_Y$, for example. Alternatively, the vias 248a, 248b, 248c, 248d, 248e, 248f, 248g, and 248h may comprise a different size than vias formed in other locations of the semiconductor device 201 within the via layers $V_1, V_2, V_3, V_4, V_5, V_6, V_7$, and $V_Y$. The vias 248a, 248b, 248c, 248d, 248e, 248f, 248g, and 248h may comprise a minimum feature size of the semiconductor device 201 in some embodiments, for example.

The conductive line layers $M_1, M_2, M_3, M_4, M_5, M_6, M_7$, and $M_X$ and the via layers $V_1, V_2, V_3, V_4, V_5, V_6, V_7$, and $V_Y$ may comprise metallization layers in a multi-level interconnect system of the semiconductor device 201, for example. Conductive lines for the semiconductor device 201 may be formed elsewhere on the semiconductor device 201 within the conductive line layers $M_1, M_2, M_3, M_4, M_5, M_6, M_7$, and $M_X$, for example, not shown. Vias may also be formed elsewhere on the semiconductor device 201 in the via layers $V_1, V_2, V_3, V_4, V_5, V_6, V_7$, and $V_Y$, for example, not shown.

The test structure 240 may be formed by first, providing a workpiece 212, as shown in the cross-sectional view of FIG. 6. The workpiece 212 may include a semiconductor substrate, body, or wafer comprising silicon or other semiconductor materials covered by an insulating layer, for example. The workpiece 212 may also include other active components or circuits, not shown. The workpiece 212 may comprise silicon oxide over single-crystal silicon, for example. The workpiece 212 may include other conductive layers or other semiconductor elements, e.g., transistors, diodes, etc. Compound semiconductors, GaAs, InP, Si/Ge, or SiC, as examples, may be used in place of silicon. The workpiece 212 may comprise a silicon-on-insulator (SOI) substrate, for example.

After active areas 249 such as transistors, memory devices, other circuitry and elements or isolation regions are formed in the workpiece 212, an insulating material 246a may be formed over the workpiece 212, and optional vias 248a and second contact pads 244a may be formed in the insulating material 246a using a damascene process. In a single damascene process, a portion of an insulating material 246a is deposited over the workpiece 212. The insulating material 246a may comprise a dielectric material such as silicon dioxide, silicon nitride, silicon oxynitride, low k materials having a dielectric constant or k value of less than about 3.9, high k materials having a dielectric constant or k value of greater than about 3.9, or multiple layers, liners, and/or combinations thereof, as examples, although other materials may also be used.

The insulating material 246a may be patterned for the pattern for the test structure 240 portion for that particular material layer (e.g., vias 248a or second contact pads 244a). The insulating material 246a is patterned using lithography (e.g., using energy and a lithography mask to pattern a photosensitive material deposited over the insulating material 246a), forming spaces in the insulating material 246a. A conductive material is deposited over the patterned insulating material 246a to fill the spaces in the insulating material 246a. The conductive material may comprise copper, aluminum, other metals, and/or one or more liners or barrier layers, as examples. Excess portions of the conductive material are removed from over the top surface of a portion of the insulating material 246a, using an etch process and/or chemicalmechanical polishing (CMP) process, for example, leaving the vias 248a formed within the portion of the insulating material 246a. Several single damascene processes may be repeated to form the other metallization layers $M_1$, $M_2$, $M_3$, $M_4$, $M_5$, $M_6$, $M_7$, $M_X$, $V_2$, $V_3$, $V_4$, $V_5$, $V_6$, $V_7$, and $V_Y$, within insulating materials 246a through 246h, for example.

Alternatively, two adjacent metallization layers such as conductive material layers $V_1$ and $M_1$, for example, may be formed in a single insulating material layer 246a using a dual damascene process to form the at least one second contact pad 244a and the vias 248a. In a dual damascene technique, two metallization layers $V_1$ and $M_1$ are formed at once within insulating material layer 246a, by patterning the insulating material layer 246a using two lithography masks and processes, and then filling the patterns within the insulating material 246a with a conductive material. The dual damascene processes may be via-first, wherein a via level such as $V_1$ is patterned before a conductive line layer such as $M_1$ is patterned, or via-last, wherein a conductive line layer such as $M_1$ is patterned before a via level such as $V_1$ is patterned, as examples. An adjacent conductive line layer such as $M_1$ and via level such as $V_1$ may be formed within a single insulating material layer 246a simultaneously with a single fill process using a dual damascene process, for example. The other conductive material layers $V_2$ and $M_2$, $V_3$ and $M_3$, $V_4$ and $M_4$, $V_5$ and $M_5$, $V_6$ and $M_6$, $V_7$ and $M_7$, and/or $V_Y$ and $M_X$ may similarly be formed using dual damascene processes.

Alternatively, the at least one first contact pad 242a, 242b, 242c, 242d, and/or 242e, the at least one second contact pad 244a, 244b, and/or 244c, and the optional vias 248a, 248b, 248c, 248d, 248e, 248f, 248g, and 248h may be patterned using a subtractive etch process, by sequentially depositing conductive material layers over the workpiece 212 and patterning the conductive material layers to form the at least one first contact pad 242a, 242b, 242c, 242d, and/or 242e, the at least one second contact pad 244a, 244b, and/or 244c, and the optional vias 248a, 248b, 248c, 248d, 248e, 248f, 248g, and 248h, and then forming the insulating materials 246a, 246b, 246c, 246d, 246e, 246f, 246g, and 246h between the patterned conductive materials, for example.

In some embodiments, the lower conductive material layers $V_1$ through $V_7$ and $M_1$ through $M_7$ may comprise copper, and the upper conductive material layers $V_Y$ and $M_X$ may comprise aluminum. Including aluminum in the upper conductive material layers $V_Y$ and $M_X$ may be beneficial for passivation purposes in some applications, for example.

In some embodiments, the at least one second contact pad 244a, 244b, and/or 244c may be disposed over the at least one first contact pad 242a, 242b, 242c, 242d, and/or 242e. In other embodiments, the at least one first contact pad 242a, 242b, 242c, 242d, and/or 242e may be disposed over the at least one second contact pad 244a, 244b, and/or 244c.

A plurality of first contact pads 242a, 242b, 242c, 242d, and/or 242e and a plurality of second contact pads 244a, 244b, and/or 244c may be disposed along one or more edges of a die 201. Two or more, dozens, or fifty or more first and second contact pads 242a, 242b, 242c, 242d, 242e, 244a, 244b, and/or 244c may be stacked vertically along an edge of a die 201 in accordance with some embodiments of the present invention. The plurality of first contact pads 242a, 242b, 242c, 242d, and/or 242e and a plurality of second contact pads 244a, 244b, and/or 244c may be vertically stacked in a single row as shown in the top view of FIG. 5 or in multiple rows in the scribe line region 202, for example.

The at least one second contact pad 244a, 244b, and/or 244c may comprise a width in a top view (see FIG. 5) comprising a dimension $d_3$ and a length comprising a dimension $d_5$. Dimension $d_3$ may comprise about 40 to 100 µm or less in some embodiments, or dimension $d_3$ may comprise greater than about 100 µm in other embodiments, for example. Dimension $d_5$ may comprise about 40 to 100 µm or less in some embodiments, or dimension $d_5$ may comprise greater than about 100 µm in other embodiments, for example. Alternatively, dimensions $d_3$ and $d_5$ may comprise other values.

The at least one first contact pad 242a, 242b, 242c, 242d, and/or 242e may comprise a width in a top view comprising a dimension $d_2$ or $d_4$ and a length comprising a dimension $d_5$. Dimension $d_2$ or $d_4$ may comprise about 10 to 30 µm or less in some embodiments, or dimension $d_2$ or $d_4$ may comprise greater than about 30 µm in other embodiments, for example. Alternatively, dimensions $d_2$ or $d_4$ may comprise other values. The width $d_2$ or $d_4$ of the at least one first contact pad 242a, 242b, 242c, 242d, and/or 242e may vary depending on the width of the saw blade and/or laser beam to be used to singulate the die 201, for example. If the workpiece 212 has been thinned using a grinding process, a thinner saw blade will be required, for example, and the width of the at least one first contact pad 242a, 242b, 242c, 242d, and/or 242e may be reduced.

The semiconductor device 201 and the test structure 240 may comprise fewer or a greater number of via layers $V_1$ through $V_Y$ and conductive line layers $M_1$ through $M_X$ than the number shown in FIG. 6, for example. The via layers $V_1$ through $V_Y$ and conductive line layers $M_1$ through $M_X$ are also referred to herein as metallization layers or conductive material layers, for example.

Before singulation of the wafer 200, the test structure 240 may be tested using an ohmmeter, voltmeter, ammeter, oscilloscope, or other testing instruments, for example, by probing the upper at least one second contact pad 244c with test probes or needles, for example, not shown. During the fabrication of the semiconductor device 200, the at least one second contact pads 244a and 244b in other conductive material layers $M_1$ and $M_4$ may also be probed for testing, to run tests as the semiconductor device 200 is being fabricated, for example.

Figure 7:
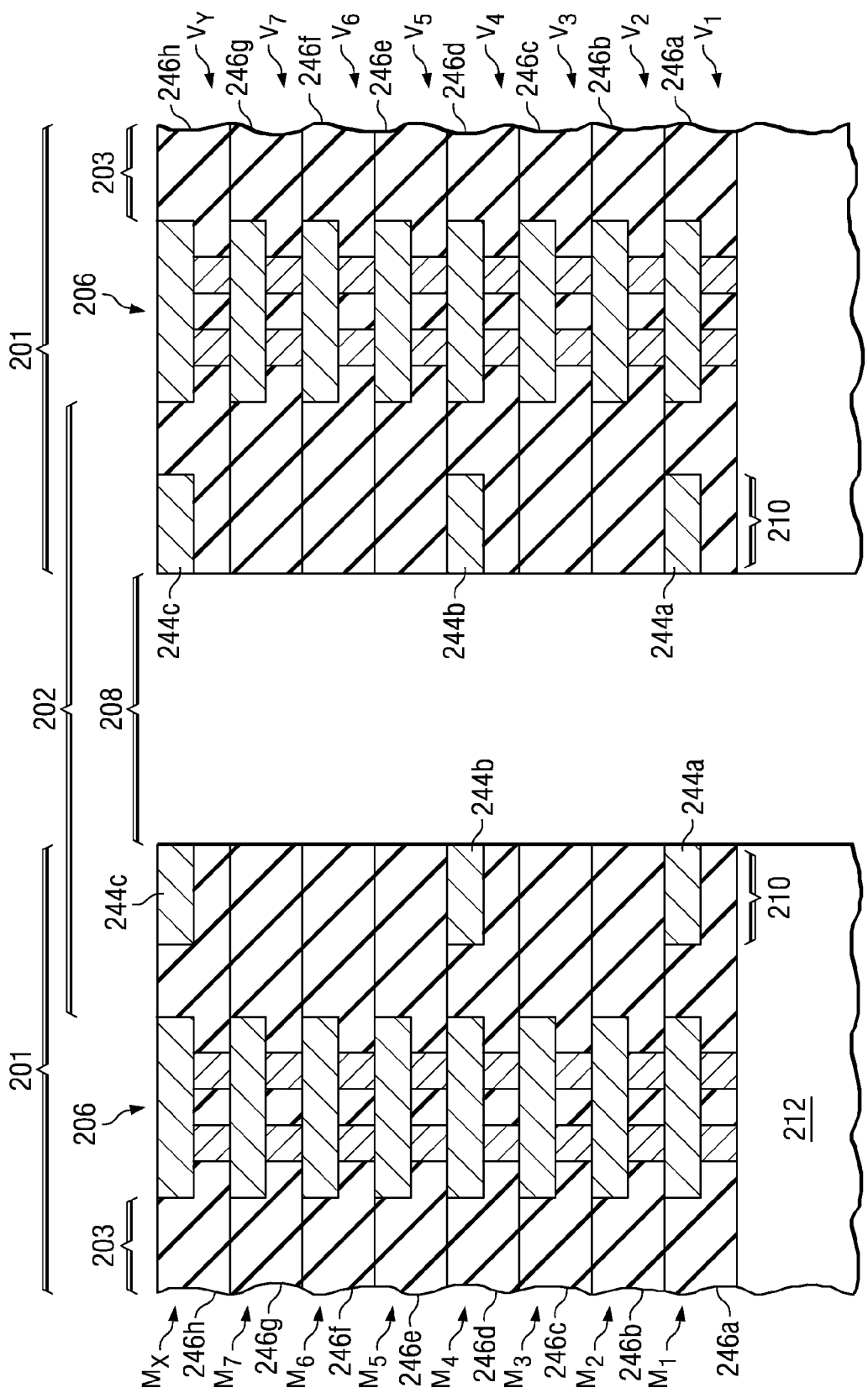
FIG. 7 shows a cross-sectional view of the test structure shown in FIG. 6 after singulation of the plurality of die.

FIG. 7 shows a cross-sectional view of the semiconductor device 200 shown in FIG. 6 after the singulation of the wafer 200 to form the plurality of die 201. A portion of the test structure 240 is disposed proximate a perimeter of the integrated circuit 201, e.g., in region 210. The portion of the test structure 240 left remaining in the integrated circuit 201 in region 210 comprises a portion of the at least one second contact pad 244a, 244b, and/or 244c disposed in conductive material layers $M_1$, $M_4$, and/or $M_X$. In some embodiments, no portion of an at least one first contact pad 242a, 242b, 242c, 242d, and/or 242e is left disposed in conductive material layers $M_2$, $M_3$, $M_5$, $M_6$, and/or $M_7$, as shown, after the singulation process.

The portions of the second contact pads 244a, 244b, and/or 244c of the test structure 240 that are left remaining after the singulation process in regions 210 may comprise the shape of a rectangle or square in a top view for each second contact pad 244a, 244b, and/or 244c formed in the scribe region 202, for example.

Figure 8:
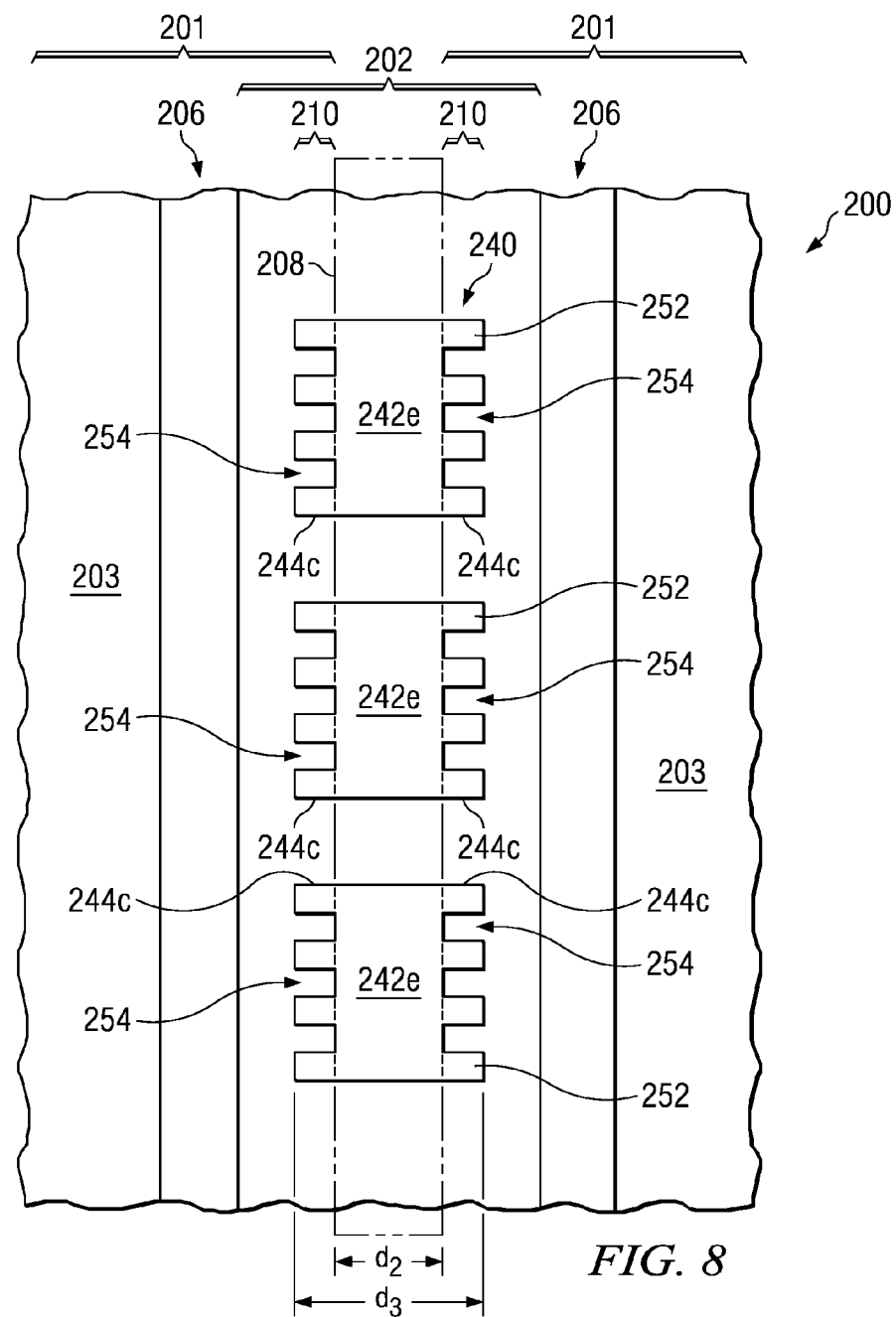
FIG. 8 is a top view of a test structure in accordance with another embodiment of the present invention.

FIG. 8 is a top view of a test structure 240 in accordance with another embodiment of the present invention. In this embodiment, to reduce the amount of metal or conductive material in the test structure 240, the edges of the second contact pads 244a, 244b, and/or 244c comprise 'fingers' or tabbed regions 252 in a top view. The tabbed regions 252 of the second contact pads 244a, 244b, and/or 244c are separated from each other by recessed regions 254. The second contact pads 244a, 244b, and/or 244c may comprise a plurality of tabbed regions 252 that extend past an edge of the first contact pads 242a, 242b, 242c, 242d, and/or 242e. The tabbed regions 252 reduce the size of the metal remaining in the test structure 240 in regions 210 after the singulation process, and further reduce the likelihood of shorts forming to a redistribution layer of a packaging system for the integrated circuit 201.

The portions of the second contact pads 244a, 244b, and/or 244c of the test structure 240 left remaining in regions 210 after the singulation process may comprise the shape of a plurality of rectangular or square shapes in a top view for each second contact pad 244a, 244b, and/or 244c formed in the scribe region 202 in this embodiment, for example.

Embodiments of the present invention include test structures 240 for integrated circuits 201, methods of forming test structures 240, semiconductor devices 200 comprising the test structures 240, and methods of manufacturing semiconductor devices 200 including the test structures 240 described herein. Embodiments of the present invention also include packaged integrated circuits including the semiconductor devices 200 and integrated circuits 201 described herein.

Figure 9:
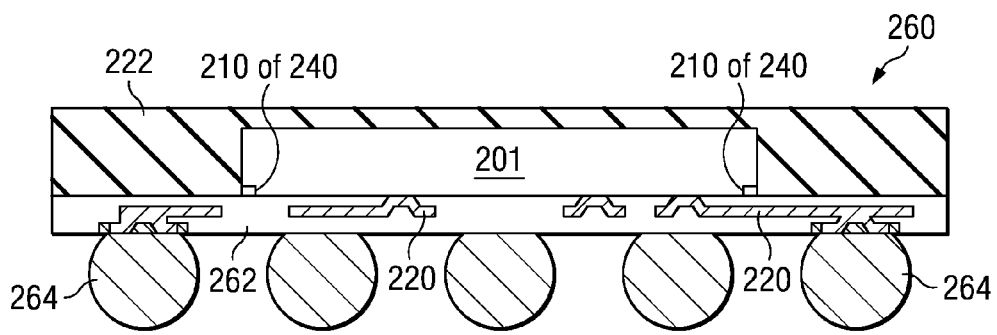
FIG. 9 shows a cross-sectional view of a packaged integrated circuit that includes a novel test structure in accordance with an embodiment of the present invention.

For example, FIG. 9 shows a cross-sectional view of a packaged integrated circuit 260 that includes an integrated circuit 201 including a portion of a novel test structure 240 in regions 210 of an embodiment of the present invention. The packaged integrated circuit 260 may comprise an eWLP that includes a redistribution layer 262 including metallization 220 adapted to couple portions of the integrated circuit 201 to solder balls 264 of the packaged integrated circuit 260. An encapsulation material 222 is disposed over the integrated circuit 201 and the redistribution layer 262, as shown. Advantageously, because no portion of the at least one first contact pad 242a, 242b, 242c, 242d, and 242e (see FIG. 6) of the test structure 240 remains in the integrated circuit 201, shorts between the test structure 240 and the redistribution layer 262 are prevented or avoided.

Embodiments of the present invention also include methods of testing semiconductor devices 200 and 201 using the novel test structures 240 described herein. In some embodiments, a method of testing a semiconductor device 200 includes providing a semiconductor device 200 including the test structures 240, and testing a parameter of the integrated circuits 201 by making electrical contact to an at least one second contact pad 244a, 244b, and/or 244c of the test structures 240. The at least one first contact pad 242a, 242b, 242c, 242d, or 242e or the at least one second contact pad 244a, 244b, or 244c may be coupled to an active area 249 of the integrated circuits 201 in some embodiments, e.g., by optional vias 248a, 248b, 248c, 248d, 248e, 248f, 248g, and/or 248h. Testing the parameter of the integrated circuits 201 may include testing an electrical parameter of the integrated circuits 201 or testing for a presence of cracks in the integrated circuits 201, as examples.

The novel test structures 240 may be formed within the metallization layers $V_1$ through $V_Y$ and $M_1$ through $M_X$ of a semiconductor device 200, and may be formed using the same lithography masks and lithography processes used to form the conductive lines and vias for the semiconductor devices 200 and 201, for example. Thus, no additional lithography masks or lithography steps are required to manufacture the novel test structures 240 in accordance with some embodiments of the present invention, advantageously. The pattern for the test structures 240 may be included in existing mask sets for semiconductor devices 200 and 201, for example.

The test structures 240 are sacrificial structures used to test semiconductor devices 200 at various stages during the manufacturing process. The test structures 240 may be formed using damascene processes, dual damascene processes, multiple damascene processes, subtractive etch processes, or combinations thereof, as examples. The test structures 240 may be formed in every metallization layer $V_1$ through $V_Y$ and $M_1$ through $M_X$ of a semiconductor device 200, or in some of the metallization layers, for example.

In some embodiments of the present invention, the test structures 240 may be formed during the formation of metallization layers such as via layers $V_1$ through $V_Y$ and conductive line layers $M_1$ through $M_X$. Alternatively, the test structures 240 described herein may be formed after fabrication of the other material layers of the integrated circuits 201.

Advantages of embodiments of the invention include providing novel test structures 240 that provide testing of semiconductor devices 200 or 201 without risking shorts to redistribution layers 262 of packaging systems for semiconductor devices 201. The test structures 240 are easily implementable into existing manufacturing process flows and semiconductor device designs.

In some embodiments, the test structures 240 may be formed proximate crack barrier structures 206. In other embodiments, the crack barrier structures 206 may not be included in the semiconductor devices 200, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure for a semiconductor device, the structure comprising:
    at least one first contact pad disposed in a first material layer in a scribe line region of the semiconductor device, the at least one first contact pad comprising a first width; and
    at least one second contact pad disposed in a second material layer proximate the at least one first contact pad in the first material layer, the at least one second contact pad comprising a second width, the second width being greater than the first width,
    wherein the structure is disposed between two crack prevention structures.

2. The structure according to claim 1, wherein the first width comprises about a width or less of a saw blade and/or laser beam for separating a plurality of die of the semiconductor device.

3. The structure according to claim 1, wherein the first material layer comprises a first conductive material layer of the semiconductor device, and wherein the second material layer comprises a second conductive material layer of the semiconductor device.

4. The structure according to claim 1, further comprising at least one third contact pad disposed proximate the at least one second contact pad, the at least one third contact pad comprising the first width.

5. The structure according to claim 4, further comprising at least one fourth contact pad disposed proximate the at least one third contact pad, the at least one fourth contact pad comprising the second width.

6. The structure according to claim 5, wherein the at least one second contact pad is disposed over the at least one first contact pad, wherein the at least one third contact pad is disposed over the at least one second contact pad, wherein the at least one fourth contact pad is disposed over the at least one third contact pad.

7. The structure according to claim 1, further comprising at least one third contact pad disposed proximate the at least one first contact pad, the at least one third contact pad comprising the second width.

8. A method of forming a structure of a semiconductor device, the method comprising:
    forming at least one first contact pad in a first material layer in a scribe line region between a plurality of die of the semiconductor device, the at least one first contact pad comprising a first width; and
    forming at least one second contact pad in a second material layer proximate the at least one first contact pad in the first material layer, the at least one second contact pad comprising a second width, the second width being greater than the first width,
    wherein forming the structure comprises forming the at least one first contact pad and forming the at least one second contact pad proximate a crack prevention structure of at least one of the plurality of die.

9. The method according to claim 8, wherein forming the structure comprises forming a test structure between two crack prevention structures of the semiconductor device.

10. The method according to claim 8, wherein forming the at least one second contact pad comprises forming the at least one second contact pad comprising a plurality of tabbed regions that extend past an edge of the at least one first contact pad.

11. The method according to claim 8, wherein forming the structure further comprises forming a plurality of vias between the at least one first contact pad and the at least one second contact pad.

12. A singulated integrated circuit chip comprising:
    an integrated circuit;
    a crack prevention structure surrounding the integrated circuit; and
    a portion of a test structure disposed proximate the crack prevention structure, the portion of the test structure comprising a portion of at least one first contact pad disposed in a first conductive material layer, wherein no portion of an at least one second contact pad is disposed in a second conductive material layer proximate the first conductive material layer, wherein the portion of the test structure is disposed on a side of the crack prevention structure opposite to the integrated circuit, and wherein the portion of the test structure is within the singulated integrated circuit chip.

13. The singulated integrated circuit chip according to claim 12, wherein the portion of the at least one first contact pad comprises a rectangular or square shape.

14. The singulated integrated circuit chip according to claim 12, wherein the portion of the at least one first contact pad comprises a plurality of rectangular or square shapes.

15. The singulated integrated circuit chip according to claim 12, wherein the portion of the test structure further comprises a portion of at least one third contact pad, wherein the portion of the at least one third contact pad is disposed in a third conductive material layer that is spaced away by at least one second conductive material layer from the first conductive material layer.

16. A packaged integrated circuit chip comprising:
    an integrated circuit chip comprising:
        an integrated circuit;
        a portion of a test structure disposed proximate a perimeter of the integrated circuit, the portion of the test structure comprising a portion of at least one first contact pad disposed in a first conductive material layer, wherein no portion of an at least one second contact pad is disposed in a second conductive material layer proximate the first conductive material layer; and
    a redistribution layer electrically coupled to the integrated circuit and disposed over the portion of the test structure and outside the integrated circuit chip.

17. The packaged integrated circuit chip according to claim 16, wherein the portion of the at least one first contact pad comprises a plurality of rectangular or square shapes.

18. The packaged integrated circuit chip according to claim 16, wherein the portion of the test structure further comprises a portion of at least one third contact pad, wherein the portion of the at least one third contact pad is disposed in a third conductive material layer that is spaced apart by at least one second conductive material layer away from the first conductive material layer.

19. A method of manufacturing a semiconductor device, the method comprising:
    forming a plurality of integrated circuits over a workpiece; and
    forming at least one structure proximate a perimeter of the plurality of integrated circuits in a scribe line region, the at least one structure comprising at least one first contact pad and at least one second contact pad proximate the at least one first contact pad, the at least one first contact pad comprising a first width, the at least one second contact pad comprising a second width, the second width being greater than the first width, and wherein forming the at least one structure comprises forming the at least one structure between two crack prevention structures.

20. The method according to claim 19, further comprising singulating the plurality of integrated circuits, wherein after singulating the plurality of integrated circuits, a portion of the at least one first contact pad remains in the plurality of integrated circuits and no portion of the at least one second contact pad remains in the plurality of integrated circuits.

21. The method according to claim 19, wherein forming the at least one structure comprises forming at least one structure comprising a plurality of vertically stacked at least one second contact pads, wherein at least one conductive line layer is disposed between each of two of the at least one second contact pads.

22. The method according to claim 19, wherein forming the at least one structure comprises forming the at least one first contact pad or the at least one second contact pad using a single damascene process, a dual damascene process, a multiple damascene process, a subtractive etch process, or combinations thereof.

23. The method according to claim 19, wherein forming the at least one structure comprises forming the at least one first contact pad or forming the at least one second contact pad during fabrication of other material layers of the plurality of integrated circuits, or after fabrication of other material layers of the plurality of integrated circuits.

24. A method of testing a semiconductor device, the method comprising:
providing the semiconductor device, the semiconductor device comprising at least one test structure proximate a perimeter of a plurality of integrated circuits in a scribe line region, the at least one test structure comprising at least one first contact pad and at least one second contact pad disposed proximate the at least one first contact pad, the at least one first contact pad comprising a first width and being disposed in a first material layer, the at least one second contact pad comprising a second width and being disposed in a second material layer, the second width being greater than the first width; and
testing a parameter of at least one of the plurality of integrated circuits by making electrical contact to an at least one second contact pad of the at least one test structure, wherein the at least one test structure is formed between two crack prevention structures.

25. The method according to claim 24, wherein providing the semiconductor device comprises providing a semiconductor device wherein the at least one first contact pad or the at least one second contact pad is coupled to an active area of the at least one of the plurality of integrated circuits, or wherein testing the parameter of the at least one of the plurality of integrated circuits comprises testing an electrical parameter of the at least one integrated circuit or testing for a presence of cracks in the at least one integrated circuit.

26. A method of forming a structure of a semiconductor device, the method comprising:
forming at least one first contact pad in a first material layer in a scribe line region between a plurality of die of the semiconductor device, the at least one first contact pad comprising a first width; and
forming at least one second contact pad in a second material layer proximate the at least one first contact pad in the first material layer, the at least one second contact pad comprising a second width, the second width being greater than the first width,
wherein forming the structure comprises forming a test structure between two crack prevention structures of the semiconductor device.

27. The method according to claim 26, wherein forming the at least one second contact pad comprises forming the at least one second contact pad comprising a plurality of tabbed regions that extend past an edge of the at least one first contact pad.

28. The method according to claim 26, wherein forming the structure further comprises forming a plurality of vias between the at least one first contact pad and the at least one second contact pad.

29. An integrated circuit chip having top and bottom surfaces and a plurality of sidewalls, the integrated circuit chip comprising:
an integrated circuit; and
a portion of a test structure comprising a portion of at least one first contact pad disposed in a first conductive material layer and no portion of an at least one second contact pad is disposed in a second conductive material layer proximate the first conductive material layer, wherein the portion of the at least one first contact pad is disposed on a sidewall of the integrated circuit chip.

30. The integrated circuit chip according to claim 29, wherein the portion of the test structure further comprises a portion of at least one third contact pad, wherein the portion of the at least one third contact pad is disposed in a third conductive material layer that is spaced away by at least one second conductive material layer from the first conductive material layer, and wherein the portion of the at least one third contact pad is disposed on the sidewall of the integrated circuit chip.

* * * * *